(12) United States Patent
Allen et al.

(10) Patent No.: US 11,935,732 B2
(45) Date of Patent: Mar. 19, 2024

(54) PROCESS KIT GEOMETRY FOR PARTICLE REDUCTION IN PVD PROCESSES

(71) Applicant: APPLIED MATERIALS, INC., Santa Clara, CA (US)

(72) Inventors: Adolph M. Allen, Oakland, CA (US); Kirankumar Neelasandra Savandaiah, Bangalore (IN); Randal D. Schmieding, Saratoga, CA (US); Vanessa Faune, San Jose, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 548 days.

(21) Appl. No.: 16/251,716

(22) Filed: Jan. 18, 2019

(65) Prior Publication Data
US 2019/0237311 A1 Aug. 1, 2019

Related U.S. Application Data

(60) Provisional application No. 62/623,081, filed on Jan. 29, 2018.

(51) Int. Cl.
*H01J 37/34* (2006.01)
*C23C 14/34* (2006.01)
(Continued)

(52) U.S. Cl.
CPC .......... *H01J 37/3441* (2013.01); *C23C 14/34* (2013.01); *C23C 14/564* (2013.01); *H01J 37/32651* (2013.01); *H01J 2237/332* (2013.01)

(58) Field of Classification Search
CPC ............ H01J 37/32651; H01J 37/3441; H01J 37/3447; C23C 14/564
(Continued)

(56) References Cited

U.S. PATENT DOCUMENTS

2005/0084654 A1* 4/2005 Takahashi ............... C23C 4/06
428/143
2005/0145176 A1 7/2005 Wicker
(Continued)

FOREIGN PATENT DOCUMENTS

JP 2007-277649 * 10/2007

OTHER PUBLICATIONS

Machine Translation of JP 2007-277649 (Year: 2007).*
International Search Report and Written Opinion dated May 9, 2019 received for PCT Application No. PCT/US2019/014207.

*Primary Examiner* — Rodney G McDonald
(74) *Attorney, Agent, or Firm* — MOSER TABOADA

(57) ABSTRACT

A process kit comprises a shield and ring assembly for positioning about a substrate support in a processing chamber to reduce deposition of process deposits on internal chamber components and an overhang edge of the substrate. The shield comprises a cylindrical band having a top wall configured to surround a sputtering target and a sloped portion of a bottom wall having a substantially straight profile with gas conductance holes configured to surround the substrate support. The ring assembly comprises a cover ring having a bulb-shaped protuberance about the periphery of the ring. The bulb-shaped protuberance of the cover ring is able to block a line-of-sight between the gas conductance holes on the shield and an entrance to a chamber body cavity in the processing chamber.

19 Claims, 4 Drawing Sheets

(51) Int. Cl.
*C23C 14/56* (2006.01)
*H01J 37/32* (2006.01)

(58) Field of Classification Search
USPC .................................................. 204/298.11
See application file for complete search history.

(56) References Cited

U.S. PATENT DOCUMENTS

| | | |
|---|---|---|
| 2008/0178801 A1* | 7/2008 | Pavloff ............. H01J 37/32477 |
| | | 118/504 |
| 2008/0276958 A1 | 11/2008 | Mehta et al. |
| 2011/0089023 A1 | 4/2011 | Tanaka et al. |
| 2011/0278165 A1 | 11/2011 | Rasheed et al. |
| 2012/0211359 A1 | 8/2012 | Riker et al. |
| 2013/0255576 A1 | 10/2013 | Rasheed et al. |
| 2013/0277203 A1 | 10/2013 | Rasheed et al. |
| 2014/0158049 A1 | 6/2014 | Rasheed et al. |
| 2016/0189938 A1 | 6/2016 | Savandaiah et al. |
| 2017/0088942 A1 | 3/2017 | Rasheed et al. |
| 2017/0098530 A1 | 4/2017 | Johanson et al. |
| 2017/0145553 A1 | 5/2017 | Liu et al. |
| 2017/0316924 A1 | 11/2017 | Cox et al. |
| 2018/0087147 A1 | 3/2018 | Rasheed et al. |

* cited by examiner

PROCESS KIT GEOMETRY FOR PARTICLE REDUCTION IN PVD PROCESSES

CROSS-REFERENCE TO RELATED APPLICATIONS

This application claims benefit of U.S. provisional application Ser. No. 62/623,081, filed Jan. 29, 2018, which is herein incorporated by reference in its entirety.

FIELD

Embodiments of the present principles generally relate to semiconductor processes and more specifically to process kit geometries for particle reduction in physical vapor deposition processes.

BACKGROUND

In the manufacture of integrated circuits and displays, a substrate such as a semiconductor wafer or display panel, is placed in a substrate processing chamber and processing conditions are set in the chamber to deposit or etch material on the substrate. A typical process chamber comprises chamber components that include an enclosure wall that encloses a process zone, a gas supply to provide a process gas in the chamber, a gas energizer to energize the process gas to process the substrate, a gas exhaust to remove spent gas and maintain a gas pressure in the chamber, and a substrate support to hold the substrate. Such chambers can include, for example, sputtering (PVD), chemical vapor deposition (CVD), and etching chambers. In PVD chambers, a target is sputtered by energized gas to sputter target material which then deposits on the substrate facing the target.

In sputtering processes, the material sputtered from the target also deposits on the edges of chamber components surrounding the target which is undesirable. The peripheral target regions have a dark-space region in which sputtered material redeposit as a result of ion scattering in dark-space area. Accumulation and build-up of the sputtered material in dark-space region is undesirable as such accumulated deposits require disassembly and cleaning or replacement of the target and surrounding components, can result in plasma shorting, and can cause arcing between the target and the chamber wall. These deposits also often debond and flake off due to thermal stresses to fall inside and contaminate the chamber and associated components.

A process kit comprising a shield and cover ring arranged about the substrate support and chamber sidewalls, is often used to receive excess sputtered material to protect and prevent deposition on the chamber walls and other component surfaces. Process kit components are disclosed which are shaped and arranged in relationship to one another to reduce the amounts of sputtered deposits formed on the internal surfaces of the process chamber and to reduce flaking of the sputtered deposits.

SUMMARY

Embodiments of a process kit shield and process kit geometries for particle reduction in physical vapor deposition processes are disclosed herein.

In some embodiments in accordance with the present principles, a shield for encircling a sputtering target that faces a substrate support in a substrate processing chamber includes a cylindrical band having a top wall configured to surround the sputtering target and a bottom wall configured to surround the substrate support, a sloped wall that extends downward and radially inward from the bottom wall of the cylindrical band, the sloped wall having a substantially straight profile and at least one gas hole located on the sloped wall to allow process gas to pass therethrough In some embodiments in accordance with the present principles, a process kit for placement about a sputtering target and a substrate support in a substrate processing chamber includes a shield configured to encircle the sputtering target and a ring assembly. In some embodiments the shield includes a cylindrical band having a top wall configured to surround the sputtering target and a bottom wall configured to surround the substrate support, a sloped wall that extends downward and radially inward from the bottom wall of the cylindrical band, the sloped wall having a substantially straight profile, and at least one gas hole located on the sloped wall to allow process gas to pass therethrough.

In some embodiments, the ring assembly includes a cover ring configured to surround the substrate support, the cover ring comprising an annular wedge comprising an inclined top surface about the substrate support, the inclined top surface having an inner and outer periphery, a bulb-shaped protuberance about the outer periphery of the inclined top surface, a footing extending downward from the inclined top surface, a projecting brim about the inner periphery of the inclined top surface, and inner and outer cylindrical bands extending downward from the annular wedge.

In some embodiments, the bulb-shaped protuberance of the cover ring blocks a line-of-sight between the at least one gas hole on the shield and an entrance to a chamber body cavity in the substrate processing chamber In some embodiments in accordance with the present principles, an apparatus for processing a substrate includes a process chamber having a process cavity and a chamber body cavity, a substrate support disposed in the process cavity, a target disposed in the process cavity opposite the substrate support and a process kit located about the substrate support and the target.

In some embodiments, the process kit includes a shield encircling the target and a ring assembly. In some embodiments the shield include a cylindrical band having a top wall that surrounds the sputtering target and a bottom wall that surrounds the substrate support, a sloped wall that extends radially inward from the bottom wall of the cylindrical band, the sloped wall having a substantially straight profile, and at least one gas hole located on the sloped wall to allow process gas to pass therethrough.

In some embodiments the ring assembly includes a cover ring located about the substrate support, the cover ring including an annular wedge comprising an inclined top surface about the substrate support, the inclined top surface having an inner and outer periphery, a bulb-shaped protuberance about the outer periphery of the inclined top surface, a footing extending downward from the inclined top surface, a projecting brim about the inner periphery of the inclined top surface, and inner and outer cylindrical bands extending downward from the annular wedge.

In some embodiments, the bulb-shaped protuberance of the cover ring blocks a line-of-sight between the at least one gas hole on the shield and an entrance to a chamber body cavity in the substrate processing chamber Other and further embodiments of the present principles are described below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the present principles and are therefore not to be considered limiting of scope, for the present principles may admit to other equally effective embodiments.

Figure 1:
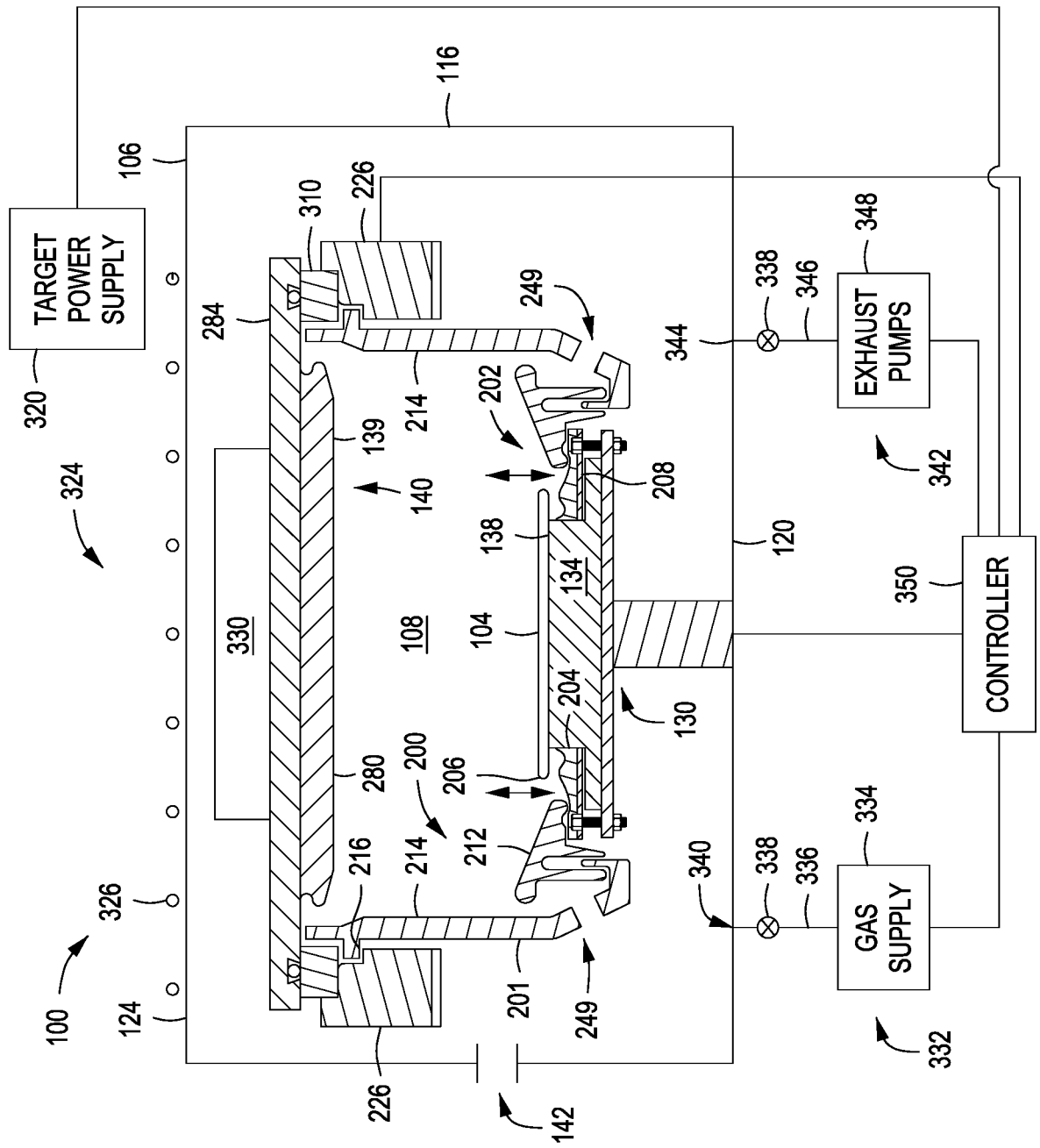
FIG. 1 depicts a high level block diagram of a substrate processing chamber in accordance with an embodiment of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

In the following detailed description, numerous specific details are set forth in order to provide a thorough understanding of exemplary embodiments or other examples described herein. However, these embodiments and examples may be practiced without the specific details. Further, the embodiments disclosed are for exemplary purposes only and other embodiments may be employed in lieu of, or in combination with, the embodiments disclosed.

FIG. 1 depicts a high level block diagram of a substrate processing chamber in accordance with an embodiment of the present principles. The substrate processing chamber 100 is representative of a CLEAN W.™ chamber commercially available from Applied Materials Inc., Santa Clara, Calif. However, other process chambers can also be used in conjunction with the present principles. The substrate processing chamber 100 of FIG. 1 illustratively comprises enclosure walls 106 that enclose a process cavity 108. The walls 106 include sidewalls 116, a bottom wall 120, and a ceiling 124. The substrate processing chamber 100 can be a part of a multi-chamber platform (not shown) having a cluster of interconnected chambers connected by a substrate transfer mechanism, such as a robot arm, that transfers substrates 104 between the various chambers. In the embodiment depicted in FIG. 1, the substrate processing chamber 100 is illustratively a sputter deposition chamber, also known as a physical vapor deposition or PVD chamber, capable of sputter depositing material such as one or more of aluminum, copper, tantalum, tantalum nitride, titanium, titanium nitride, tungsten and tungsten nitride, onto a substrate 104.

The substrate processing chamber 100 comprises a substrate support 130 which comprises a pedestal 134 to support the substrate 104. The pedestal 134 has a substrate receiving surface 138 having a plane substantially parallel to a sputtering surface 139 of an overhead sputtering target 140. The substrate receiving surface 138 of the pedestal 134 receives and supports the substrate 104 during processing. The pedestal 134 may include an electrostatic chuck or a heater such as an electrical resistance heater or heat exchanger. In operation, a substrate 104 is introduced into the substrate processing chamber 100 through a substrate loading inlet 142 in the sidewall 116 of the substrate processing chamber 100 and placed onto the substrate support 130. The support 130 can be lifted or lowered by support lift bellows and a lift finger assembly can be used to lift and lower the substrate 104 onto the support 130 during placement of the substrate 104 on the substrate support 130 by a robot arm. The pedestal 134 can be maintained at an electrically floating potential or grounded during plasma operation.

Figure 2:
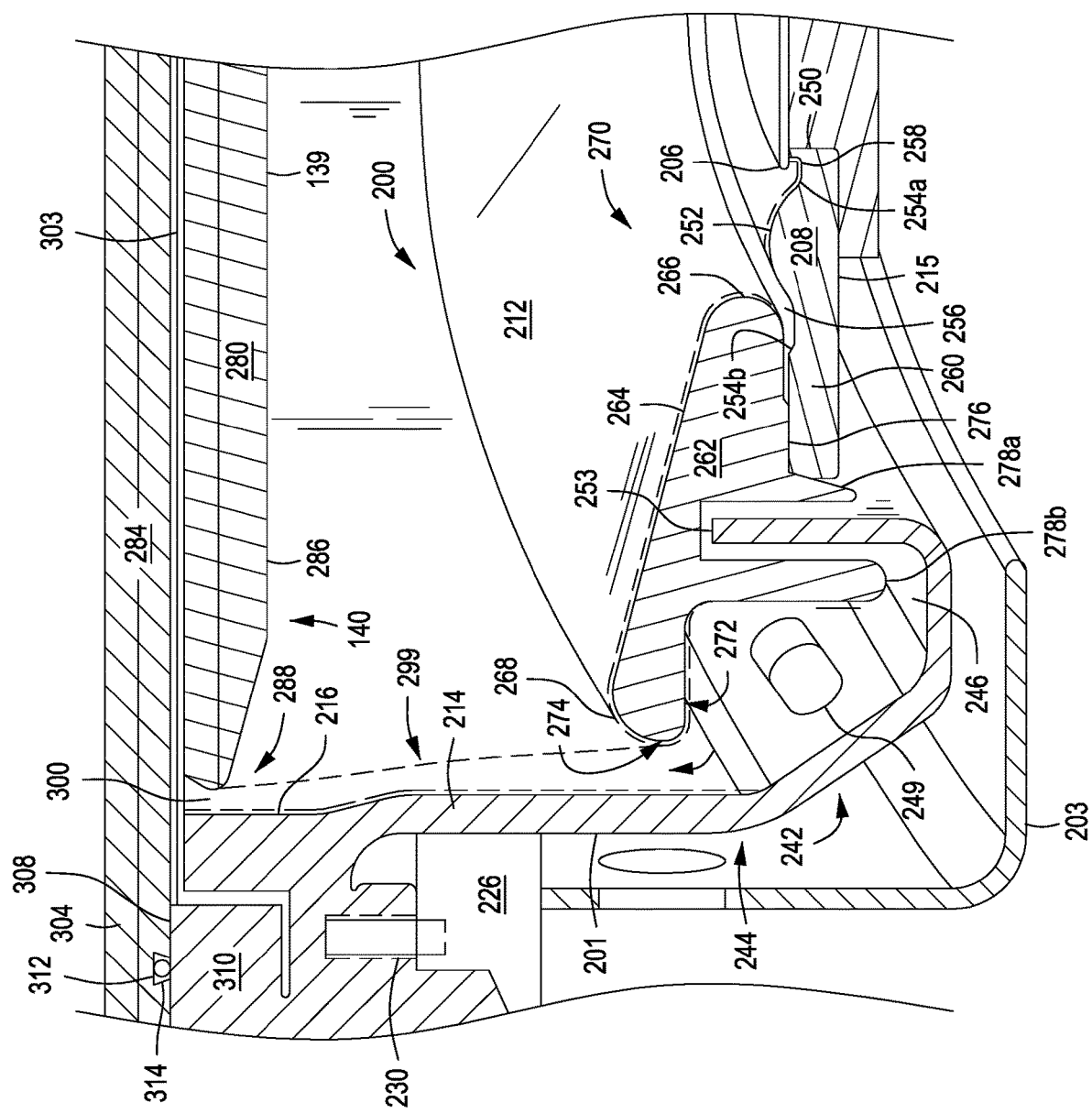
FIG. 2 depicts a perspective view of the substrate processing chamber of FIG. 1 and a process kit having a shield and ring assembly within the substrate processing chamber in accordance with an embodiment of the present principles.

FIG. 2 depicts a perspective view of the substrate processing chamber 100 of FIG. 1 including a process kit 200 in accordance with an embodiment of the present principles. Referring to FIG. 1 and FIG. 2 interchangeably, the sputtering target 140 comprises a sputtering plate 280 mounted to a backing plate 284. The sputtering plate 280 comprises a material to be sputtered onto the substrate 104. The sputtering plate 280 can include a central cylindrical mesa 286 having a sputtering surface 139 that forms a plane that is parallel to the plane of the substrate 104. An annular inclined rim 288 surrounds the cylindrical mesa 286. The annular rim 288 can be inclined relative to the plane of the cylindrical mesa 286 by an angle of at least about 80 degrees, for example, from about 100 to about 200 degrees.

The complex shape of the annular inclined rim 288 and a sidewall that is adjacent to a top wall 216 of a shield 201 in the substrate processing chamber 100, forms a convoluted gap 300 comprising a dark space region; an area which is highly depleted of free electrons and which can be modeled as a vacuum. The dark-space region is controlled to prevent plasma entry, arcing and instabilities. The shape of the gap 300 acts as a labyrinth that impedes the passage of sputtered plasma species through the gap 300, and thus, reduces the accumulation of sputtered deposits on the surfaces of the peripheral target region.

The backing plate 284 has a support surface 303 to support the sputtering plate 280 and a peripheral ledge 304 that extends beyond the radius of the sputtering plate 280. The peripheral ledge 304 of the backing plate 284 comprises an outer footing 308 that rests on an isolator 310 in the substrate processing chamber 100. The peripheral ledge 304 contains an O-ring groove 312 into which an O-ring 314 is placed to form a vacuum seal. The isolator 310 electrically isolates and separates the backing plate 284 from the substrate processing chamber 100, and is typically a ring formed from a dielectric or insulating material such as aluminum oxide. The peripheral ledge 304 is shaped to inhibit the flow or migration of sputtered material and plasma species through the gap 300 between the target 140 and the isolator 310, to impede the penetration of sputtered deposits into the gap 300.

The sputtering target 140 is connected to a target power supply 320 which applies a bias voltage to the target 140. While the target power supply 320 supplies power to the target 140, the gas energizer 324 energizes the sputtering gas to form a plasma of the sputtering gas. The gas energizer 324 may comprise a source coil 326 that is powered by the application of a current through the coil 326. The plasma formed energetically impinges upon and bombards the sputtering surface 139 of the target 140 to sputter material off the sputtering surface 139 and onto the substrate 104.

The substrate processing chamber 100 can comprise a magnetic field generator 330 to shape a magnetic field about the target 140 to improve sputtering of the target 140. The capacitively generated plasma can be enhanced by the magnetic field generator 330 in which for example, a permanent magnet or electromagnetic coils can provide a magnetic field in the substrate processing chamber 100 that has a rotating magnetic field having an axis that rotates parallel to the plane of the substrate 104. The magnetic field generator 330 can generate a magnetic field near the target 140 of the substrate processing chamber 100 to increase an ion density in a high-density plasma region adjacent to the target 140 to improve the sputtering of the target 140 material. The magnetic field extends through the substantially non-magnetic target 140 into the substrate processing chamber 100.

The sputtering gas is introduced into the substrate processing chamber 100 through a gas delivery system 332, which provides gas from a gas supply 334 via conduits 336 having gas flow control valves 338, such as a mass flow controllers, to pass a set flow rate of the gas there-through. The gases are fed to a mixing manifold (not shown) in which the gases are mixed to from a desired process gas composition and fed to a gas distributor 340 having gas outlets to introduce the gas into the substrate processing chamber 100. The process gas can comprise a non-reactive gas, such as argon or xenon, which is capable of energetically impinging upon and sputtering material from the target 140. The process gas can also comprise a reactive gas, such as one or more of an oxygen-containing gas and a nitrogen-containing gas, that are capable of reacting with the sputtered material to form a layer on the substrate 104. The gas is then energized by the gas energizer 324 to form a plasma to sputter the sputtering target 140. Spent process gas and byproducts are exhausted from the substrate processing chamber 100 through an exhaust system 342. The exhaust system 342 comprises an exhaust port 344 that receives spent process gas and passes the spent gas to an exhaust conduit 346 having a throttle valve to control the pressure of the gas in the substrate processing chamber 100. The exhaust conduit 346 is connected to one or more exhaust pumps 348.

The substrate processing chamber 100 can be controlled by a controller 350 that comprises program code having instruction sets to operate components of the substrate processing chamber 100 to process a substrate 104. For example, the controller 350 can comprise program code that includes substrate positioning instruction sets to operate the substrate support 130 and substrate transfer mechanism; gas flow control instruction sets to operate gas flow control valves to set a flow of sputtering gas to the substrate processing chamber 100; gas pressure control instruction sets to operate the exhaust throttle valve to maintain a pressure in the substrate processing chamber 100; gas energizer control instruction sets to operate the gas energizer 324 to set a gas energizing power level; and process monitoring instruction sets to monitor the process in the substrate processing chamber 100.

In the embodiment of FIG. 1 and FIG. 2, the process kit 200 comprises a shield 201 and a ring assembly 202 for placement about a peripheral wall 204 of the substrate support 130 that terminates before an overhanging edge 206 of the substrate 104. The ring assembly 202 comprises a deposition ring 208 and a cover ring 212. The deposition ring 208 comprises an annular band 215 surrounding the support 130. The cover ring 212 at least partially covers the deposition ring 208. The deposition ring 208 and cover ring 212 cooperate with one another to reduce formation of sputter deposits on the peripheral walls 204 of the support 130 and the overhanging edge 206 of the substrate 104.

As depicted in FIG. 2 and described above, the deposition ring 208 comprises an annular band 215 that extends about and surrounds the peripheral wall 204 of the support 130. The annular band 215 comprises an inner lip 250 which extends transversely from the annular band 215 and is substantially parallel to the peripheral wall 204 of the support 130. The inner lip 250 terminates immediately below the overhanging edge 206 of the substrate 104. The inner lip 250 defines an inner perimeter of the deposition ring 208 which surrounds the periphery of the substrate 104 and substrate support 130 to protect regions of the substrate support 130 that are not covered by the substrate 104 during processing. For example, the inner lip 250 surrounds and at least partially covers the peripheral wall 204 of the support 130 that would otherwise be exposed to the processing environment, to reduce or even entirely preclude deposition of sputtering deposits on the peripheral wall 204. The deposition ring 208 can also serve to protect the exposed side surfaces of the support 130 to reduce erosion by the energized plasma species.

In the embodiment depicted in FIG. 1 and FIG. 2, the annular band 215 of the deposition ring 208 has a semi-circular protuberance 252 that extends along the central portion of the annular band 215 with radially inward dips 254a,b on either side of the semi-circular protuberance 252. The radially inward dip 254a is spaced apart from the cover ring 212 to form an arc-shaped gap 256 there-between which acts a labyrinth to reduce penetration of plasma species into the arc-shaped gap 256. An open inner channel 258 lies between the inner lip 250 and the semi-circular protuberance 252. The open inner channel 258 extends radially inward to terminate at least partially below the overhanging edge 206 of the substrate 104. The open inner channel 258 facilitates the removal of sputtering deposits from these portions during cleaning of the deposition ring 208. The deposition ring 208 also has a ledge 260 which extends outward and is located radially outward of the semi-circular protuberance 252. The ledge 260 serves to support the cover ring 212.

As depicted in FIG. 2 and described above, the cover ring 212 encircles and at least partially covers the deposition ring 208 to receive, and thus, shadow the deposition ring 208 from the bulk of the sputtering deposits. The cover ring 212 comprises an annular wedge 262 comprising an inclined top surface 264 that is sloped radially inwards and encircles the substrate support 130. The angle of the inclined top surface 264 of the cover ring 212 is designed to, for example, minimize the buildup of sputter deposits nearest to the overhanging edge 206 of the substrate 104, which would otherwise negatively impact the deposition uniformity obtained across the substrate 104.

The inclined top surface 264 of the annular wedge 262 has an inner and outer periphery 266, 268. The inner periphery 266 comprises a projecting brim 270 which overlies the radially inward dip 254a comprising an open inner channel 258 of the deposition ring 208. The projecting brim 270 reduces deposition of sputtering deposits on the open inner channel 258 of the deposition ring 208. The projecting brim 270 projects a distance corresponding to at least about half the width of the arc-shaped gap 256 formed with the deposition ring 208. The projecting brim 270 is sized, shaped, and positioned to cooperate with and complement the arc-shaped gap 256 to form a convoluted and constricted flow path between the cover ring 212 and deposition ring 208 that inhibits the flow of process deposits onto the peripheral wall 204. The constricted flow path of the narrow gap 256 restricts the build-up of low-energy sputter deposits on the mating surfaces of the deposition ring 208 and cover ring 212, which would otherwise cause them to stick to one another or to the peripheral overhanging edge 206 of the substrate 104.

About the outer periphery 268 of the inclined top surface 264 is a bulb-shaped protuberance 272. In the embodiment of FIG. 2, the bulb-shaped protuberance 272 comprises an elliptical circumferential surface 274 that forms an arc-shaped gap with the shield 201.

The cover ring 212 comprises a footing 276 extending downward from the inclined top surface 264 of the annular wedge 262, to rest upon the ledge 260 of the deposition ring 208. The footing 276 extends downwardly from the wedge 262 to press against the deposition ring 208 substantially without cracking or fracturing the deposition ring 208. The cover ring 212 further comprises inner and outer cylindrical bands 278a,b that extend downwardly from the annular wedge 262, with a gap there-between. In some embodiments, the inner and outer cylindrical bands 278a,b are substantially vertical. The cylindrical bands 278a,b are located radially outward of the footing 276 of the wedge 262. The inner cylindrical band 278a has a height that is smaller than the outer cylindrical band 278b.

The cover ring 212 can be adjustable and effectively shields the gas conductance hole(s) 249 of the shield 201 at a range of different heights. For example, the cover ring 212 is capable of being raised and lowered to adjust the height of the cover ring 212 in relationship to the substrate support 130 in the chamber.

As depicted in FIG. 2, the shield 201 of the process kit 200 encircles the sputtering surface 139 of the sputtering target 140 that faces the substrate support 130 and the outer periphery of the substrate support 130. The shield 201 covers and shadows the sidewalls 116 of the substrate processing chamber 100 to reduce deposition of sputtering deposits originating from the sputtering surface 139 of the sputtering target 140 onto the components and surfaces behind the shield 201. For example, the shield 201 can protect the surfaces of the support 130, overhanging edge 206 of the substrate 104, sidewalls 116 and bottom wall 120 of the substrate processing chamber 100.

In the embodiment depicted in FIG. 2, the shield 201 comprises a cylindrical band 214 having a diameter sized to encircle the sputtering surface 139 of the sputtering target 140 and the substrate support 130. The cylindrical band 214 has a top wall 216 that surrounds the sputtering surface 139 of the sputtering target 140. An annular adapter 226 of the shield 201 surrounds the sidewalls 116 of the substrate processing chamber 100. A plurality of pins 230 are spaced apart and positioned along a circle or circular arrangement along the adapter 226. In some embodiments, at least three pins 230 are positioned in a circle on the adapter 226. Each pin 230 can comprise a rigid member constructed from a material such as, for example, steel or for example, stainless steel.

The shield 201 comprises a bottom wall 242 that surrounds the substrate support 130. A sloped wall 244 extends inward from the bottom wall 242 of the cylindrical band 214 and surrounds the substrate support 130. In the embodiment depicted in FIG. 2, the sloped wall 244 comprises a substantially straight profile. That is, the inventors determined that flaking of sputtered material deposited on the shield 201 is reduced if the sloped wall 244 comprises a substantially straight profile in comparison to a BKM process chamber which comprises a sloped step in a lower portion of the shield. Therefore, making the sloped wall 244 more straight in comparison with a sloped step reduces flaking of sputtered material deposited on the shield 201.

The sloped wall 244 of the shield 201 forms an outer leg of a channel 246 with at least one gas conductance hole 249 to allow process gas to pass there-through. The channel 246 also comprises an inner second leg 253 spaced apart from the sloped wall 244. The shield 201 allows for gas from the substrate processing chamber 100 to pass through the gas conductance hole(s) 249 and circulate through the channel 246 and enter the process cavity 108 (e.g., a processing volume). Although in the embodiment depicted in FIG. 2 the gas conductance hole(s) 249 in the sloped wall 244 is substantially rectangular-shaped, in other embodiments in accordance with the present principles, the gas conductance holes in the sloped wall 244 can subscribe substantially any shape. In addition, although in the embodiment depicted in FIG. 2 the gas conductance hole(s) 249 is illustratively located in a middle portion of the sloped wall 244, in alternate embodiments, the gas conductance hole(s) 249 can be located substantially anywhere along the sloped wall 244 as long as the cover ring 212 can prevent the gas passing through the gas conductance hole(s) 249 of the shield 201 from having a direct line-of-sight to the gap 300. For example, in some embodiments, the gas conductance hole(s) 249 can be located on a lower portion of the sloped wall 244.

In accordance with embodiments of the present principles, the bulb-shaped protuberance 272 of the cover ring 212, the angle and length of the sloped wall 244 of the shield 201 and the size, shape and location of the gas conductance hole(s) 249 on the shield 201 are designed to and cooperate to reduce the flaking of sputtered material deposited on process kit components and to block line-of-sight deposition from exiting the process cavity 108 and entering a chamber body cavity (e.g., a non-processing volume). More specifically, the bulb-shaped protuberance 272 of the cover ring 212, the angle and length of the sloped wall 244 of the shield 201 and the shape and location of the gas conductance hole(s) 249 on the shield 201 are designed to reduce the flaking of sputtered deposits on process kit components and to prevent the gas passing through the gas conductance hole(s) 249 of the shield 201 from having a direct line-of-sight to the gap 300 between the target 140 and the isolator 310, to contain Plasma in the process cavity 108 and, as such, prevent sputtered deposits carried by the Plasma from entering into the gap 300.

The inventors determined that flaking of sputtered material deposited on the shield 201 is reduced if the sloped wall 244 comprises a substantially straight profile. More specifically, making the slope wall 244 in the lower portion of the shield 201 substantially straight results in better film adherence of the sputtered depositions onto the shield 201 and less flaking of the sputtered depositions. The inventors further determined that the sloped wall 244 had to be angled to enable the protuberance 272 of the cover ring 212 to block line-of-sight between the gas conductance hole(s) 249 of the shield 201 and the gap 300 between the target 140 and the isolator 310. In addition, the length of the sloped wall 244 has to be such that a gas conductance hole(s) 249 can be located on the sloped wall 244 such that a line-of-sight between the gas conductance hole(s) 249 of the shield 201 and the gap 300 between the target 140 and the isolator 310 is able to be blocked by the protuberance 272 of the cover ring 212. In some embodiments in accordance with the present principles, the gas conductance hole(s) 249 are located on the sloped wall 244 of the shield 201 in a position typically lower than gas conductance of BKM process kits and as such the gas conductance hole(s) 249 are located closer to the cover ring 212. In one embodiment, a process kit in accordance with the present principles includes a shield 201 having conductance hole(s) 249 with a width of approximately 0.45 inches, for example, from about 0.2 inches to about 0.8 inches and a length of approximately 1.6 inches, for example, from about 1 to about 2 inches. The shield 201 can further include a sloped wall 244 with an angle of approximately 25 degrees, for example, from about 15 degrees to about 45 degrees. With such a configuration, a process kit 200 in accordance with the present principles results in less flaking of sputtered depositions from the shield 201. In addition, the line-of-sight between the gas conductance hole(s) 249 of the shield 201 and the gap 300 between the target 140 and the isolator 310 is blocked by the bulb-shaped protuberance 272 of the cover ring 212 preventing sputtered deposits carried by the Plasma from entering into the gap 300.

In FIG. 2, the dotted line 299 originating at the gap 300 between the target 140 and the isolator 310 and extending toward the protuberance 272 of the cover ring 212 represents the line-of-site between the between the gas conductance hole(s) 249 of the shield 201 and the gap 300. As depicted in FIG. 2, the bulb-shaped protuberance 272 of the cover ring 212, the angle and length of the sloped wall 244 of the shield 201 and the gas conductance hole(s) 249 on the shield 201 are shaped and arranged in relationship to one another to block the line-of-sight between the gas conductance hole(s) 249 of the shield 201 and the gap 300 between the target 140 and the isolator 310 and to reduce flaking of sputtered deposits, at least on the shield 201.

In a process kit 200 in accordance with the present principles, the gas conductance hole(s) 249 are located lower on the shield 201 and on the sloped wall 244 of the shield 201, differing from a best known method (BKM) process kit in which the conductance holes are parallel to a surface of the cylindrical band 214 and located higher on the shield. The geometry of the process kit 200 in accordance with the present principles requires a liner 203 of the process kit 200 to extend farther inward to contain the plasma. That is, with reference back to FIG. 2, the process kit 200 can further comprise a liner 203. The liner 203 of FIG. 2 is illustratively located between the adapter 226 and the shield 201, extending down to the level of the base of the shield 201 and moved inward, as compared to BKM process kits, to shadow the gas conductance hole(s) 249 of the shield 201, which are located on a sloped wall 244 of a bottom portion of the shield 201 and relatively closer to the cover ring 212 as compared to a BKM process kit.

Figure 4:
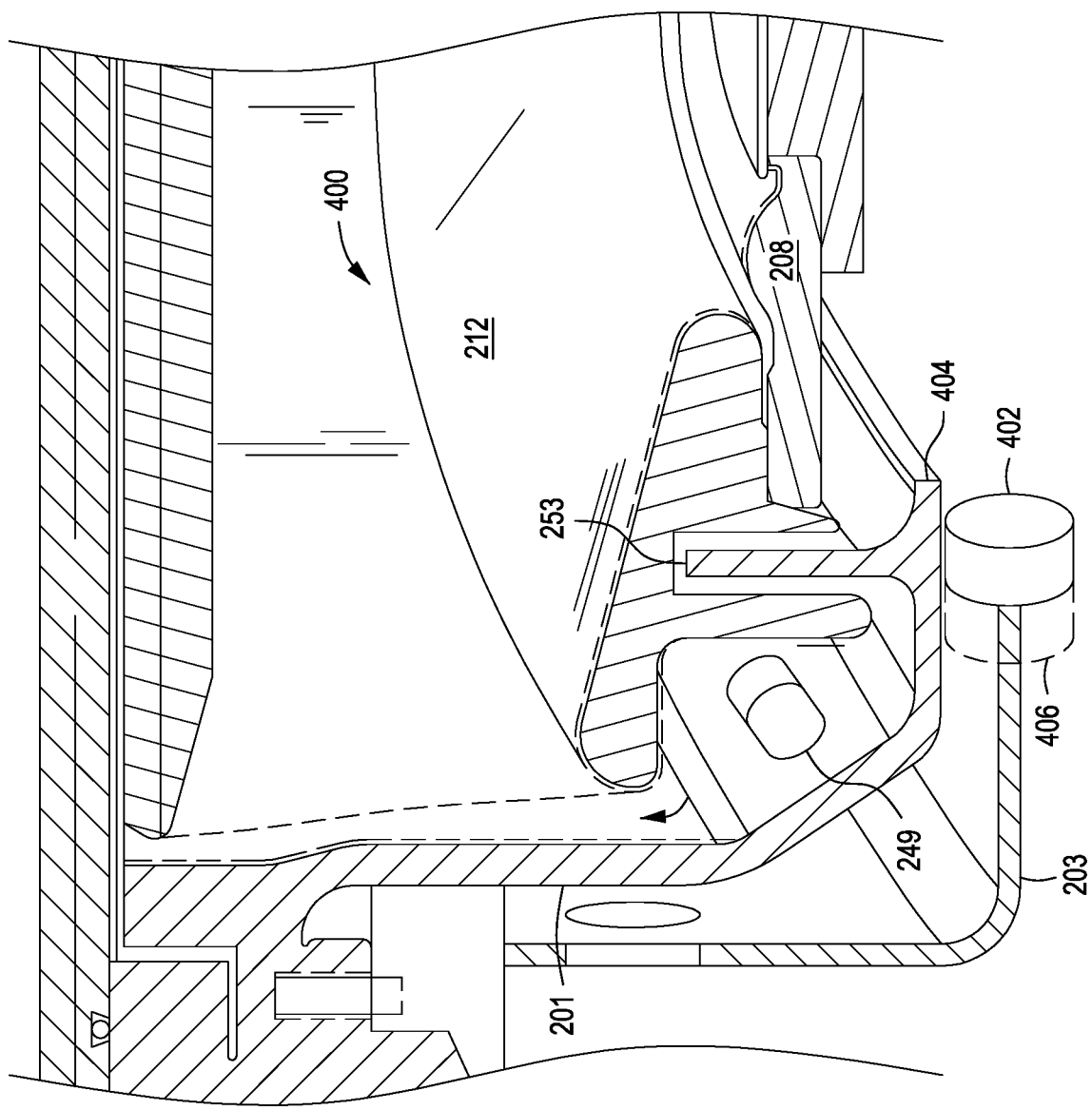
FIG. 4 depicts a perspective view of the substrate processing chamber of FIG. 1 and a process kit having a shield and ring assembly within the substrate processing chamber in accordance with an alternate embodiment of the present principles.

In a process chamber comprising a shield grounding unit, the shield grounding unit is made smaller to enable moving inward a liner of a process kit in accordance with the present principles. FIG. 4 depicts a perspective view of the substrate processing chamber 100 of FIG. 1 including a process kit 400 in accordance with an alternate embodiment of the present principles. The substrate processing chamber 100 of FIG. 4 includes a process kit 400, a liner 203 and a shield grounding unit 402. The process kit 400 of FIG. 4 comprises a shield 201, a cover ring 212 and a deposition ring 208. As depicted in FIG. 4, the shield grounding unit 402 is located under the shield 201 and implemented to ground the shield 201. The shield grounding unit 402 depicted in FIG. 4 has been reduced in size to enable moving inward the liner 203 of a process kit 400 to effectively contain plasma. The dotted portion 406 of the shield grounding unit 404 in FIG. 4 represents a portion of the shield grounding unit 404 that has been removed to accommodate the placement of the liner 203 with respect to the shield 201 to shadow the gas conductance hole(s) 249 in the shield 201 and to contain plasma.

As depicted in FIG. 4, because of the reduction in the size of the shield grounding unit 404, the shield 201 only slightly makes contact with the shield grounding unit 402. As such, in the embodiment of FIG. 4, the inner second leg 253 of the shield 201 illustratively comprises a flange 404 for making contact with the shield grounding unit 402. As recited above, the reduced-size shield grounding unit 402 makes possible the inward movement of the liner 203 for properly shadowing the conductance hole(s) 249 of the shield 201 and to contain plasma.

In some embodiments in accordance with the present principles, gas conductance in the process chamber is taken into account when shaping and arranging at least the bulb-shaped protuberance 272 of the cover ring 212, the angle and length of the sloped wall 244 of the shield 201 and the gas conductance hole(s) 249 on the shield 201 in relationship to one another. More specifically, in substrate processing chambers, such as the substrate processing chamber 100 of FIG. 1, a high-conductance gas flow pathway is needed to both supply the necessary process gasses to the process cavity and to properly exhaust spent process gas. In some embodiments in accordance with the present principles, in addition to shaping and arranging, in relationship to one another, the bulb-shaped protuberance 272 of the cover ring 212, the angle and length of the sloped wall 244 of the shield 201 and the gas conductance hole(s) 249 on the shield 201 to block the line-of-sight between the gas conductance holes 249 of the shield 201 and the gap 300 between the target 140 and the isolator 310 and to reduce flaking of sputtered deposits, the bulb-shaped protuberance 272 of the cover ring 212, the angle and length of the sloped wall 244 of the shield 201 and the gas conductance hole(s) 249 on the shield 201 are further shaped and arranged to attempt to maximize a gas conductance in the substrate processing chamber 100 or at least match a gas conductance of a best-known method (BKM).

Figure 3B:
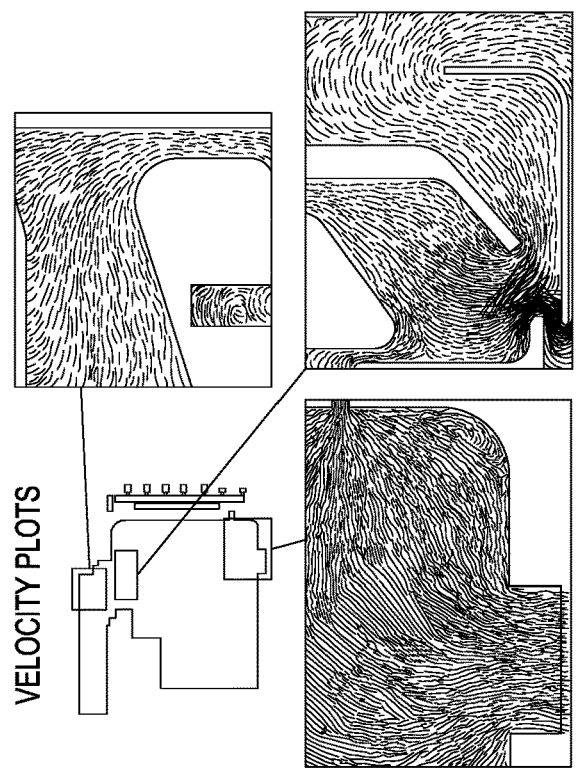
FIG. 3B depicts a plot of gas flow velocities for a substrate processing chamber in accordance with embodiments of the present principles.
Figure 3A:
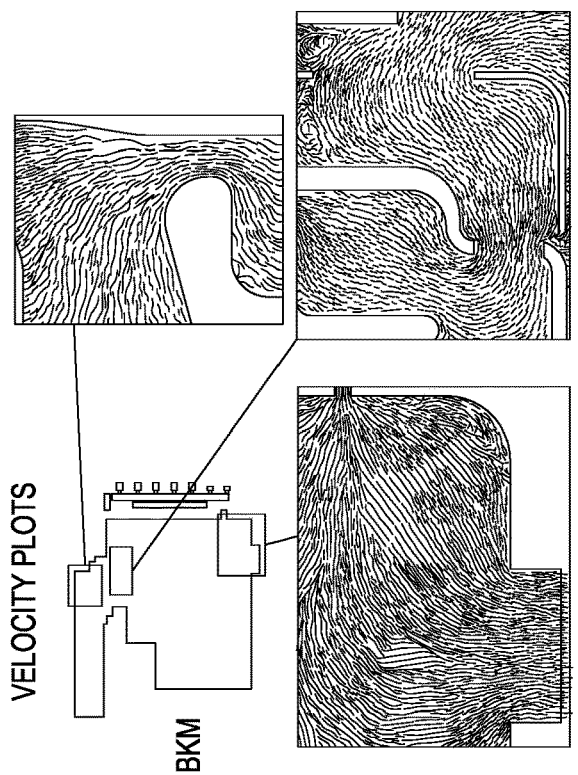
FIG. 3A depicts a plot of gas flow velocities for a best-known method (BKM) substrate processing chamber generated using computer-aided engineering (CAE) analysis.

FIG. 3A depicts a plot of gas flow velocities for a BKM substrate processing chamber generated using computer-aided engineering (CAE) analysis. FIG. 3B depicts a plot of gas flow velocities for a substrate processing chamber in accordance with the present principles, such as the substrate processing chamber 100 of FIG. 1, generated using CAE analysis. As determinable from a comparison of the plots of FIG. 3A and FIG. 3B, a maximum velocity of the gas conductance of a processing chamber in accordance with the present principles is in-line with a BKM processing chamber. A comparison of the plots of FIG. 3A and FIG. 3B further depicts that a velocity of a gas around the gas conductance hole(s) 249 in the sloped wall 244 of the shield 201 of the substrate processing chamber 100 of FIG. 1 is lower than a velocity of a gas around a gas conductance slot of a BKM substrate processing chamber. As such, there will be less particle adders on a surface of a substrate in a substrate processing chamber 100 in accordance with the present principles at least because a lower velocity gas will result in less flaking of sputtered deposits on the surfaces of the process cavity 108 and because a lower velocity gas will carry less loose sputtered particles.

In some embodiments in accordance with the present principles, the exposed surfaces of at least one of the shield 201, the deposition ring 208 and the cover ring 212 are treated with a coating to improve particle retention of films deposited on the exposed surfaces during substrate processing. The coating generally includes protrusions which provide micro or macro texturing on the exposed surfaces. In one embodiment, the coating can include the Lava Coat or Lava Coat II coating available from Applied Materials, Inc., Santa Clara, Calif. In some embodiments, the coating can include rounded particles, semicircular protrusions, and/or can include other shapes and geometries. The protrusions of the coating can include discrete protrusions separate from adjacent protrusions. Alternatively or in addition, the surface texturing of the coating can comprise a wave profile to improve particle adhesion. The wave profile of the coating can be formed by etching, bead or grit, blasting, laser ablation, or 3D printing. In some embodiments, the coating can be applied to the entire exposed surfaces of the substrate processing chamber 100 and the process kit 200 or can alternatively be applied to only portions of the exposed surfaces of the substrate processing chamber 100 and the process kit 200. In some other embodiments, the exposed surfaces of any of the components of the substrate processing chamber 100 are treated with a coating to improve particle retention of films deposited on the exposed surfaces during substrate processing as described above.

The inventors performed a mole fraction analysis test on a process kit in accordance with the present principles, as described above, to determine how well the process conditions with reactive gases match a BKM process kit. Although some discrepancies were noted when looking closely into areas of the process cavity, the process conditions with reactive gases of a process kit in accordance with the present principles match well at the macro level.

The process kit 200 described above significantly increase the number of process cycles and processing time in the substrate processing chamber 100, increasing the amount of time between cleaning. Such advantages are accomplished by reducing an amount of flaking for sputtering deposits formed on the components around the substrate 104 and reducing an amount of sputtering deposits being carried by a gas toward the gap 300 between the target 140 and the isolator 310.

While the foregoing is directed to embodiments of the present principles, other and further embodiments may be devised without departing from the basic scope thereof. For example, the process kit 200 or components thereof can be used in other types of applications, as would be apparent to one of ordinary skill, for example, etching, CVD and etching chambers. Therefore, the spirit and scope of the appended claims should not be limited to the description of the embodiments contained herein.

The invention claimed is:

1. A process kit shield configured to encircle a sputtering target that faces a substrate support in a substrate processing chamber including a cover ring located about the substrate support, the cover ring comprising an annular wedge comprising an inclined top surface about the substrate support, the inclined top surface having an inner and outer periphery and a bulb-shaped protuberance about the outer periphery of the inclined top surface, the process kit shield comprising:
a cylindrical band having a top wall configured to surround the sputtering target and a bottom wall configured to surround the substrate support;
a sloped wall that extends downward and radially inward from the bottom wall of the cylindrical band, the sloped wall having a substantially straight profile; and
at least one gas hole located on a lower portion of the sloped wall to allow process gas to pass therethrough, wherein the at least one gas hole is located on the lower portion of the sloped wall such that the bulb-shaped protuberance of the cover ring blocks a line-of-sight between the at least one gas hole on the shield and an entrance to a chamber body cavity of the substrate processing chamber when installed in the substrate processing chamber.

2. The process kit shield of claim 1, wherein the at least one gas hole in the sloped wall comprises a substantially rectangular shape.

3. The process kit shield of claim 1, wherein the at least one gas hole in the sloped wall comprises a width of approximately from 0.2 inches to about 0.8 inches and a length of approximately from 1 inch to 2 inches.

4. The process kit shield of claim 1, wherein the sloped wall comprises an angle of approximately from 15 degrees to 45 degrees.

5. The process kit shield of claim 1, comprising at least one of a micro or macro texture coating on exposed surfaces of the shield.

6. The process kit shield of claim 5, wherein the micro or macro texture coating comprises at least one of rounded particles or semicircular protrusions.

7. A process kit configured for placement about a sputtering target and a substrate support in a substrate processing chamber, the process kit comprising:
a shield configured to encircle the sputtering target, the shield comprising:
a cylindrical band having a top wall configured to surround the sputtering target and a bottom wall configured to surround the substrate support;
a sloped wall that extends downward and radially inward from the bottom wall of the cylindrical band, the sloped wall having a substantially straight profile; and
at least one gas hole located on a lower portion of the sloped wall to allow process gas to pass therethrough;
and
a ring assembly comprising:
a cover ring configured to encircle the substrate support, the cover ring comprising an annular wedge comprising an inclined top surface about the substrate support, the inclined top surface having an inner and outer periphery, a bulb-shaped protuberance about the outer periphery of the inclined top surface, a footing extending downward from the inclined top surface, a projecting brim about the inner periphery of the inclined top surface, and inner and outer cylindrical bands extending downward from the annular wedge;
wherein the at least one gas hole is located on the lower portion of the sloped wall such that the bulb-shaped protuberance of the cover ring blocks a line-of-sight between the at least one gas hole and an entrance to a chamber body cavity of the processing chamber when installed in the substrate processing chamber.

8. The process kit of claim 7, wherein the at least one gas hole on the lower portion of the sloped wall of the shield comprises a substantially rectangular shape.

9. The process kit of claim 7, wherein the at least one gas hole on the lower portion of the sloped wall of the shield comprises a width of approximately from 0.2 inches to about 0.8 inches and a length of approximately from 1 inch to 2 inches.

10. The process kit of claim 7, wherein the sloped wall of the shield comprises an angle of approximately from 15 degrees to 45 degrees.

11. The process kit of claim 7, comprising at least one of a micro or macro texture coating on exposed surfaces of at least one of the substrate processing chamber, the shield or the cover ring.

12. The process kit of claim 11 wherein the micro or macro texture coating comprises at least one of rounded particles or semicircular protrusions.

13. The process kit of claim 7, wherein the ring assembly further comprises a deposition ring to support the cover ring by the footing and to shield a periphery of a substrate located on the substrate support.

14. The process kit of claim 7, further comprising a liner configured to encircle the shield to contain a plasma in a process cavity of the substrate processing chamber.

15. An apparatus for processing a substrate, comprising:
a process chamber having a process cavity and a chamber body cavity;
a substrate support disposed in the process cavity;
a target disposed in the process cavity opposite the substrate support;
a process kit located about the substrate support and the target, the process kit comprising:
a shield encircling the target, the shield comprising:
a cylindrical band having a top wall that surrounds the target and a bottom wall that surrounds the substrate support;
a sloped wall that extends radially inward from the bottom wall of the cylindrical band, the sloped wall having a substantially straight profile; and
at least one gas hole located on a lower portion of the sloped wall to allow process gas to pass therethrough;
and
a ring assembly comprising:
a cover ring located about the substrate support, the cover ring comprising:
an annular wedge comprising an inclined top surface about the substrate support, the inclined top surface having an inner and outer periphery;
a bulb-shaped protuberance about the outer periphery of the inclined top surface;
a footing extending downward from the inclined top surface, a projecting brim about the inner periphery of the inclined top surface; and
inner and outer cylindrical bands extending downward from the annular wedge;
wherein the at least one gas hole is located on the lower portion of the sloped wall such that the bulb-shaped protuberance of the cover ring blocks a line-of-sight between the at least one gas hole on the shield and an entrance to the chamber body of the process chamber.

16. The apparatus of claim 15, wherein the bulb-shaped protuberance of the cover ring blocks a line-of-sight between the at least one gas hole on the shield and an entrance to the chamber body cavity of the process chamber.

17. The apparatus of claim 15, comprising at least one of a micro or macro texture coating on exposed surfaces of at least one of the process cavity of the process chamber, the shield or the cover ring.

18. The apparatus of claim 17, wherein the micro or macro texture coating comprises at least one of rounded particles or semicircular protrusions.

19. The apparatus of claim 17, wherein the process kit further comprises at least one of a deposition ring to support the cover ring by the footing and to shield a periphery of a substrate located on the substrate support or a liner encircling the shield to contain a plasma in the process cavity of the process chamber.

* * * * *